US012726171B2

(12) United States Patent
Page et al.

(10) Patent No.: US 12,726,171 B2
(45) Date of Patent: Sep. 1, 2026

(54) FREQUENCY TUNABLE RF PHASE SHIFTER OR CIRCULATOR HAVING A WIDE-BAND SAW-MULTIFERROIC HYBRID DEVICE

(71) Applicant: Government of the United States, as represented by the Secretary of the Air Force, Wright-Patterson AFB, OH (US)

(72) Inventors: Michael R. Page, Powell, OH (US); Derek A. Bas, Dayton, OH (US); Piyush J. Shah, West Chester, OH (US); Michael J. Newburger, Plain City, OH (US); Michael E McConney, Beavercreek, OH (US); Amber N. Reed, Fairborn, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 693 days.

(21) Appl. No.: 18/339,695

(22) Filed: Jun. 22, 2023

(65) Prior Publication Data

US 2023/0336144 A1 Oct. 19, 2023

Related U.S. Application Data

(63) Continuation-in-part of application No. 17/717,264, filed on Apr. 11, 2022, now Pat. No. 12,347,914.

(Continued)

(51) Int. Cl.
*H03H 9/02* (2006.01)
*H03H 9/17* (2006.01)

(52) U.S. Cl.
CPC .... *H03H 9/02574* (2013.01); *H03H 9/02661* (2013.01); *H03H 9/171* (2013.01)

(58) Field of Classification Search
CPC ........... H03H 9/02574; H03H 9/02661; H03H 9/171; H01P 1/19
See application file for complete search history.

(56) References Cited

U.S. PATENT DOCUMENTS 4,024,452 A 5/1977 Seidel
4,078,186 A * 3/1978 Folen .................. H03H 9/0296 333/152

(Continued)

FOREIGN PATENT DOCUMENTS

EP 1530249 A1 5/2005

OTHER PUBLICATIONS

Y.-X. Guo, Z.-Y. Zhang, and L. C. Ong, "Improved wide-band Schiffman phase shifter", IEEE Transactions Microwave Theory and Techniques., Mar. 2006, vol. 54, No. 3., pp. 1196-1200.

(Continued)

*Primary Examiner* — Pedro J Cuevas
(74) *Attorney, Agent, or Firm* — AFMCLO/JAZ; Richard M. Mescher

(57) ABSTRACT

A nonreciprocal microwave phase shifter or circulator includes a substrate, a transducer on a surface of the substrate and configured to reciprocally convert between electrical signals to acoustic waves, a first piezoelectric material configured to generate and transport acoustic waves from a signal applied to the transducer, and a thin film magnetic material configured to couple to acoustic waves through magnetoelastic coupling so as to have nonreciprocal magnetoelastic coupled acoustic wave transport. Phase shifts of (Continued)

acoustic waves through the thin film magnetic material in directions toward and away the transducer have significantly different magnitudes.

35 Claims, 9 Drawing Sheets

Related U.S. Application Data

(60) Provisional application No. 63/180,895, filed on Apr. 28, 2021.

(56) References Cited

U.S. PATENT DOCUMENTS

| | | | | |
|---|---|---|---|---|
| 4,209,759 | A * | 6/1980 | Volluet | G06G 7/195 708/817 |
| 5,260,615 | A * | 11/1993 | Sahashi | H03H 9/426 333/201 |
| 6,046,657 | A * | 4/2000 | Alers | H03H 9/135 333/201 |
| 6,688,162 | B2 * | 2/2004 | Bachas | G01N 33/4905 73/579 |
| 7,205,701 | B2 * | 4/2007 | Liu | G01S 13/755 310/313 R |
| 7,759,134 | B2 * | 7/2010 | Chin | G01N 27/745 422/50 |
| 9,196,940 | B2 | 11/2015 | Brown et al. | |
| 9,548,413 | B2 | 1/2017 | Tripon-Canseliet et al. | |
| 10,601,400 | B1 | 3/2020 | McConney et al. | |
| 11,283,486 | B1 * | 3/2022 | McKnight | H04B 5/24 |
| 11,791,566 | B2 * | 10/2023 | Sepulveda | H01Q 9/0407 343/702 |
| 12,347,914 | B2 * | 7/2025 | Page | H03H 9/14505 |
| 12,531,049 | B2 * | 1/2026 | Salahuddin | G10K 11/36 |
| 2002/0166382 | A1 * | 11/2002 | Bachas | G01N 33/4905 73/579 |
| 2007/0183190 | A1 * | 8/2007 | Eyckmans | H03K 19/19 257/E43.004 |
| 2021/0305491 | A1 | 9/2021 | Spanier et al. | |
| 2022/0367998 | A1 | 11/2022 | Page et al. | |

OTHER PUBLICATIONS

B. An, G. Chaundhary, and Y. Jeong, "Wideband Tunable Phase Shifter With Low In-Band Phase Deviation Using Coupled Line", IEEE Microwave Wireless Components Letter, Aug. 2018, vol. 28, No. 8, pp. 678-680.

J. Zhang et al., "Broadband tunable phase shifter for microwaves", AIP Advances, Jun. 22, 2020, vol. 10, No. 6, pp. 065128.

F. Goelden, A. Gaebler, M. Goebel, A. Manabe, S. Mueller, and R. Jakoby, "Tunable liquid crystal phase shifter for microwave frequencies", Engineering Physics—Electronics Letter, Jun. 18, 2009, vol. 45, No. 13, pp. 1-2.

M. Yasir, S. Bistarelli, A. Cataldo, M. Bozzi, L. Perregrini, and S. Bellucci, "Tunable Phase Shifter Based on Few-Layer Graphene Flakes", IEEE Microwave Wireless Components Letter, Jan. 2019, vol. 29, No. 1, pp. 47-49.

Á. Palomares-Caballero, A. Alex-Amor, P. Escobedo, J. Valenzuela-Valdez, and P. Padilla, "Low- Loss Reconfigurable Phase Shifter in Gap-Waveguide Technology for mm-Wave Applications", IEEE Transactions on Circuits and Systems II: Express Briefs, Mar. 9, 2020, vol. 67, No. 12, pp. 3058-3062.

C. Tripon-Canseliet et al., "Optically controlled microwave phase shifting and sampling by efficient photoconductive switching on LT-GaAs substrate integrated technology", Photonics North 2006, Sep. 2006, vol. 6343, pp. 803-811.

M.F. Lewis et al., "Acoustic-surface-wave isolator", Applied Physics Letters, 1972, vol. 20, pp. 276-278.

R. Verba et al., "Phase Nonreciprocity of Microwave-Frequency Surface Acoustic Waves in Hybrid Heterostructures with Magnetoelastic Coupling", Advanced Electronic Materials, Aug. 2021, vol. 7, Issue 8, pp. 2100263.

Derek A. Bas et al., "Nonreciprocity of Phase Accumulation and Propagation Losses of Surface Acoustic Waves in Hybrid Magnetoelastic Heterostructures", Physical Review Applied, Oct. 3, 2022, vol. 18, 044003.

D.G. Haigh. "Wideband active microwave isolators using GaAs MMIC Technology", IEE Proceeding—Microwaves, Antennas, and Propagation, Apr. 1996, vol. 143, pp. 179-183.

D.G. Huff et al. "Optoelectronic isolator for microwave applications", IEEE Transactions Microwave Theory and Techniques, May 1990, vol. 38, pp. 571-576.

R. Fleury et al., "Sound isolation and giant linear nonreciprocity in a compact acoustic circulator", Science, Jan. 31, 2014, vol. 343, pp. 516-519.

G.A. Peterson et al., "Demonstration of efficient nonreciprocity in a microwave optomechanical circuit". Physical Review. X, Jul. 6, 2017, vol. 7, pp. 031001.

R. Sasaki et al. "Nonreciprocal propagation of surface acoustic wave in Ni/LiNbO3". Physical Review B, Jan. 10, 2017, vol. 95 , pp. 020407.

R. Verba et al., "Nonreciprocal surface acoustic waves in multilayers with magnetoelastic and interfacial Dzyaloshinskii-Moriya interactions", Physical Review Applied, Jun. 12, 2018, vol. 9, pp. 064014.

R. Verba et al., "Wide-band nonreciprocity of surface acoustic waves induced by magnetoelastic coupling with a synthetic antiferromagnet", Physical Review Applied, Nov. 2019, vol. 12, pp. 054061.

* cited by examiner

FREQUENCY TUNABLE RF PHASE SHIFTER OR CIRCULATOR HAVING A WIDE-BAND SAW-MULTIFERROIC HYBRID DEVICE

CROSS-REFERENCE TO RELATED APPLICATIONS

This application is a continuation-in-part patent application under 35 USC § 120 to co-pending and commonly owned U.S. patent application Ser. No. 17/717,264 entitled "Giant Nonreciprocity of Surface Acoustic Waves Enabled by the Magnoelastic Interaction" filed 11 Apr. 2022, which in turn claims the benefit to U.S. Provisional Application No. 63/180,895 entitled "Giant Nonreciprocity of Surface Acoustic Waves Enabled by the Magnoelastic Interaction", filed 28 Apr. 2021, the contents of each of which are incorporated herein by reference in their entirety.

RIGHTS OF THE GOVERNMENT

The invention described herein may be manufactured and used by or for the Government of the United States for all governmental purposes without the payment of any royalty.

FIELD OF THE INVENTION

The present invention relates generally to nonreciprocal radio frequency (RF) phase shift devices and, more particularly, to such nonreciprocal RF phase shift devices that are enabled by magnetoelastic coupling.

BACKGROUND OF THE INVENTION

Microwave nonreciprocal phase devices, such as tunable phase shifters and circulators, have an important role in the front-end of most RF systems, as well as test and measurement equipment. These devices selectively shift the phase of a signal depending on whether propagation is in one direction or the opposite direction. From an application point-of-view, the phase device should include low insertion loss (that is, allow substantial low-loss transmission).

In 1971, M. F. Lewis proposed an alternative form of acoustic isolator device concept using a layered surface acoustic wave (SAW) delay line with a ZnO/YIG on GGG substrate. See M. F. Lewis and E. Patterson, "Acoustic-surface-wave isolator", Applied Physics Letters, 20, 276 (1972). While acoustic isolator device concepts have been largely ignored for decades, these concepts are the subject of very recent theoretical investigations generating significant interest. In general, nonreciprocal propagation of surface acoustic waves (SAWs) is nontrivial to achieve and has been observed in nonmagnetic metal (aluminum) and some semiconductor heterostructures. However, the nonreciprocity magnitude is not sufficient for real-world application relevance. Spin wave (SW) nonreciprocity has been an active area of research interest resulting in numerous reports in the last decade. The theoretical framework that explains SW nonreciprocity is either based on frequency displacement in the ferromagnetic layer or on interband magnonic transitions in a system with lack of time-reversal symmetry.

More recent investigation includes device physics utilizing magnetoelastic interactions of spin and acoustic waves. This is based on traveling SAWs coupling into a magnetostrictive ferromagnetic thin film in the SAW propagation path. The most common materials system studied on this subject is Ni on lithium niobate ($LiNbO_3$), which has been shown to have reciprocal transmission behavior due to polycrystallinity of the Ni film. Ni has a relatively large Gilbert damping coefficient that results in wide line widths and a shallow peak in the magnetization response. Several device concepts, such as magnetically tunable phase shifters and resonators, were reported in the 1970s that utilized magnetoelastic interactions. The recent resurgence of study in magnetoelastic interactions utilizing SAWs is being termed as acoustically driven ferromagnetic resonance (ADFMR) or acoustically driven spin wave resonance (AD-SWR).

SAW-based frequency filters, delay lines, and sensors are mature technologies and have several applications in the RF frequency (low MHz up to 10 GHz) regime. Ultra-low loss, temperature compensated SAW filters are essential elements in military and consumer communication devices such as cell phones and tablets. Acoustic transmission is advantageous because the propagation speeds and wavelengths are typically several orders of magnitude lower than for electromagnetic waves and therefore scaling down is easily achieved.

Roman Verba et al. in "Phase Nonreciprocity of Microwave-Frequency Surface Acoustic Waves in Hybrid Heterostructures with Magnetoelastic Coupling" (Advanced Electronic Materials, Vol. 7, Issue 8, August 2021, 2100263) predicted that in addition to nonreciprocal loss (described in U.S. Patent Application Publication No. US 2022/0367998 A1, entitled "Giant Nonreciprocity of Surface Acoustic Waves Enabled by the Magnetoelastic Interaction", which published 17 Nov. 2022, the disclosure of which is hereby expressly incorporated by reference in its entirety), magnetoelastic coupling could also theoretically be used to induce phase shift nonreciprocity. In contrast to previous studies, Roman Verba et al. found that the phase nonreciprocity requires the coupling of SAW to a strongly nonreciprocal SW, having the nonreciprocal splitting of the SW spectrum much larger than the strength of the magnetoelastic coupling. In turn, this should be much larger than the geometric mean of the SW and SAW damping rates. In this study, the hybridized SAW in the spectral region between the magnetoelastic gaps demonstrated significant phase nonreciprocity, retaining, at the same time, propagation losses that are close to those of unhybridized SAW.

However, there remains a strong need for a microfabricated miniature tunable-band phase shifter and/or circulator that has an ability to operate at frequencies from 1000 MHz to 50 GHz, and more preferably at frequencies from 1000 MHz to 100 GHz.

SUMMARY OF THE INVENTION

The present invention overcomes the foregoing problems and other shortcomings, drawbacks, and challenges of providing a microfabricated miniature phase shifter/circulator that has an ability to operate at frequencies from 1000 MHz to 50 GHz, and more preferably at frequencies from 1000 MHz to 100 GHz. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, a nonreciprocal microwave phase shift device comprises a substrate, a plurality of transducers on a surface of the substrate and configured to reciprocally convert between electrical signals and acoustic waves, a first piezoelectric material configured to generate and transport acoustic waves from a signal applied to a first transducer of the plurality of transducers, and a thin film magnetic material configured to couple to acoustic waves through magnetoelastic coupling so as to have non-reciprocal magnetoelastic coupled acoustic wave transport. Transmission of acoustic waves through the thin film magnetic material in a direction toward a second transducer of the plurality of transduces has a first magnitude and transmission of acoustic waves through the thin film magnetic material in a direction away from the second transducer of the plurality of transducers has a second magnitude, the first and second magnitudes being significantly different.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 1:
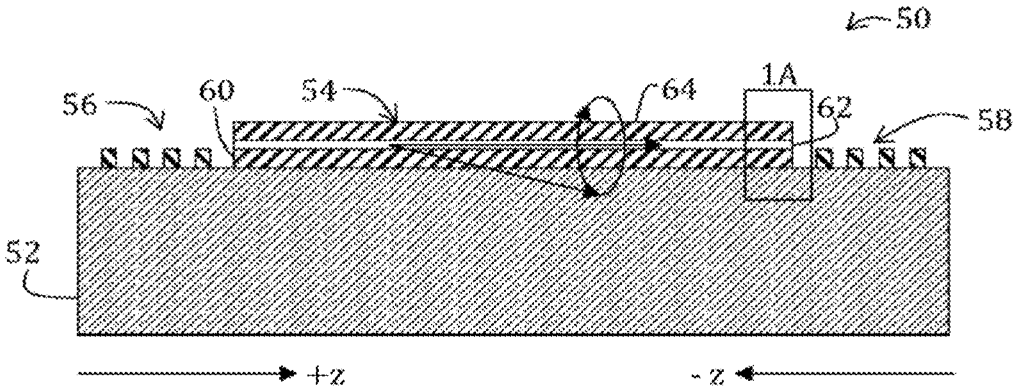
FIG. 1 illustrates a nonreciprocal RF phase device according to an embodiment of the present invention.

Referring now to FIG. 1, a device 50 according to an embodiment of the present invention is shown. The physical mechanism of the proposed phase device is based on the coupling between acoustic waves in a substrate 52 and spin waves in an adjacent magnetic film or stack of films 54. The configuration of the film 54 allows for a strongly nonreciprocal dispersion law of spin waves, while magnetoelastic coupling effectively shifts the phase of acoustic waves differently depending on their direction of travel.

The device 50 of FIG. 1 is a split-finger interdigital transducer (IDT) design, generating Rayleigh waves using a single crystal y-cut $LiNbO_3$ substrate. Favorable SAW propagation is along the z-axis between the first or input IDT 56 and the second or output IDT 58 for the delay line filter geometry. The split-finger design minimizes the destructive interference caused by reflection from the IDTs 56, 58 and thereby allows the device 50 to operate at higher odd harmonics of the fundamental frequency. The nominal designed fundamental frequency $f_1$ is around 291 MHz, however, most of the reported measurements are at higher harmonic $f_3$, and $f_7$=873, 1455 and 2037 MHz, respectively. The illustrated IDTs 56, 58 have 60 finger pairs with the minimum electrode separation $\lambda/8$=1.5 μm. The delay line spacing between the IDT pairs is 3 mm. IDT patterning for metal-liftoff was completed using negative tone lift-off photoresist NR9-1000Py and a Karl Suss MA6 mask aligner contact lithography system. The Al electrode thickness is 70 nm, deposited using e-beam evaporation. Details on the SAW device design, fabrication, and its impact on ADFMR performance are discussed in D. A. BAS et al., "Optimization of acoustically driven ferromagnetic resonance devices," J. Appl. Phys., Vol. 126 (2019) 114501.

Figure 1A:
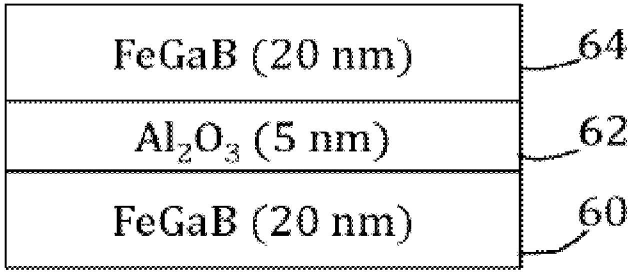
FIG. 1A illustrates a multilayer thin film stack of the device of FIG. 1.
Figure 2:
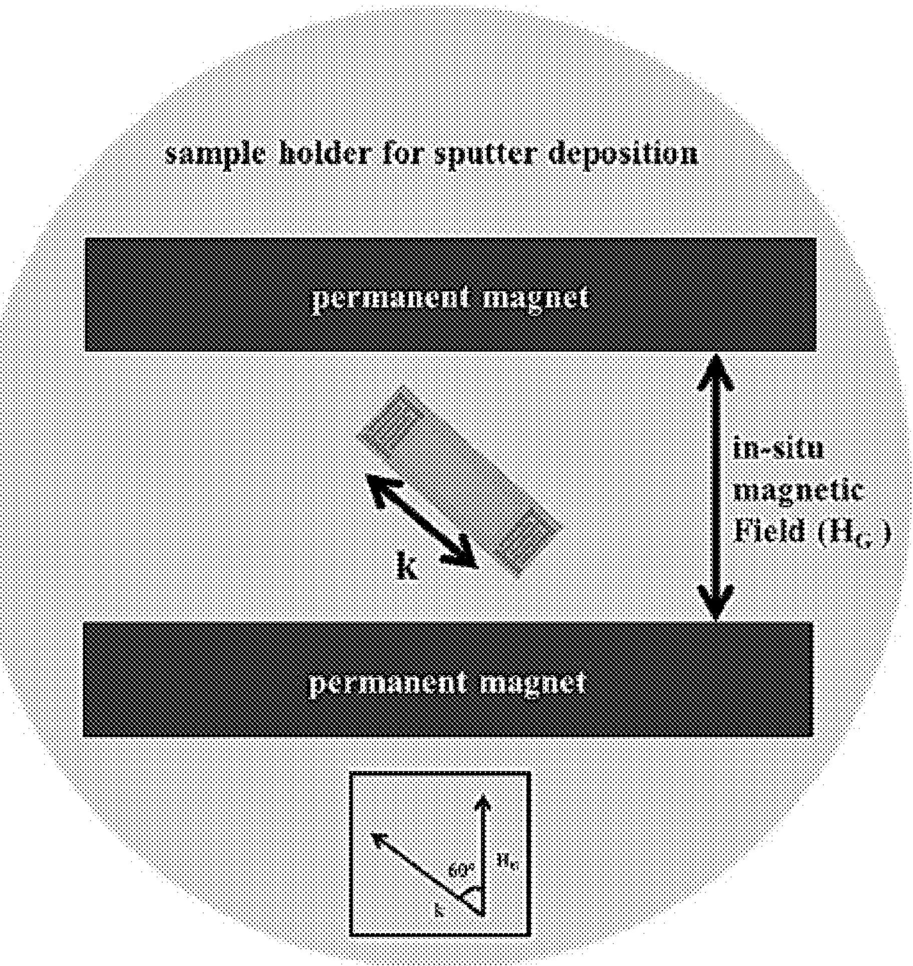
FIG. 2 schematically shows in-situ magnetic field orientation with respect to the SAW k-vector for the device of FIG. 1.

The multilayer thin-film stack 54 is positioned in a space between the IDTs 56, 58. The stack 54, shown in more detail in FIG. 1A, includes thin-films of FeGaB 60, $Al_2O_3$ 62, and FeGaB 64, which may be deposited via sputtering and lithographically patterned with width 500 μm along x and length 2200 μm along z. The film stack 54 is deposited in the presence of an external magnetic field. A schematic figure of in-situ magnetic field orientation with respect to the SAW k-vector is shown in FIG. 2.

It can be seen from the above, that the embodied invention is a miniature high-frequency tunable RF/microwave phase shifter/circulator based on combining typical static surface acoustic wave filters with phase shifter properties enabled by non-reciprocal ferromagnetic resonance in layered ferromagnetic/ferrimagnetic materials. The above disclosed phase shifter/circulator achieves significant tuning ranges with good speed (several GHz/ms), small size ($mm^3$ scale), good out-of-band transmission/reflection/absorption properties, good in-band transmission/reflection/absorption properties and low power consumption.

The present invention addresses a strong need for a microfabricated miniature tunable-band phase shifter and/or circulator that has the ability to operate at frequencies from 1000 MHz-up to 50 GHz, and more preferably 1000 MHz-up to 100 GHz. An example of this need for this technology is in weapons systems that use high frequency microwaves (2-50 GHZ or even 2-100 GHZ), currently available phase shifters and/or circulators for these systems are incredibly expensive ($10,0005) and very bulky. Typical currently available phase shifters and/or circulators with very small footprints have static frequency isolation on the order of 20 dB (for example see: https://www.hitachi-metals.co.jp/e/products/elec/tel/p01_06.html). In comparison, the present invention has much more isolation (more than 48 dB) with a more narrow bandwidth of 30 MHz and the device is tunable, a significant improvement upon the state of the art. Furthermore, currently available existing miniature phase shifters and/or circulators are still about −0.1-1 cubic centimeter in volume, which is not small enough to be used in cell phones. In comparison, the present invention is inherently small enough to implement in a cell phone.

There are many other methods that have been used or proposed for isolators/circulators, including ferromagnetic resonance, RF-photonics, superconductors, complex circuits, and other mechanisms. The most commonly used approach for RF phase shifters and/or circulators is to use a ferromagnetic resonance circulator and connect a load to one of the three ports of the circulator. These prior isolation technologies are similar to the present invention except the prior magnetic isolators utilize ferromagnetic resonance (FMR) that is driven directly by RF in that these isolators use (often broad band) ferromagnetic resonance in a magnetic material for the nonreciprocal nature of the resonance. These typical magnetic phase shifters and/or circulators excite ferromagnetic resonance through electromagnetic fields that are transmitted to the magnetic core by a microstripline, other conductor or cavity, whereas the present invention first converts the microwave radiation to an acoustic wave with a piezoelectric material, then acoustic driven FMR is used to isolate the signal. Unlike the prior technologies, the present invention should meet the needed metrics of tunable phase devices for mobile devices, namely >20% tuning range, with <3 dB insertion loss, with <30 V, at a low cost (only a few US Dollars or less), and in a compact package (<1 $mm^3$).

Figures 3A, 3B:
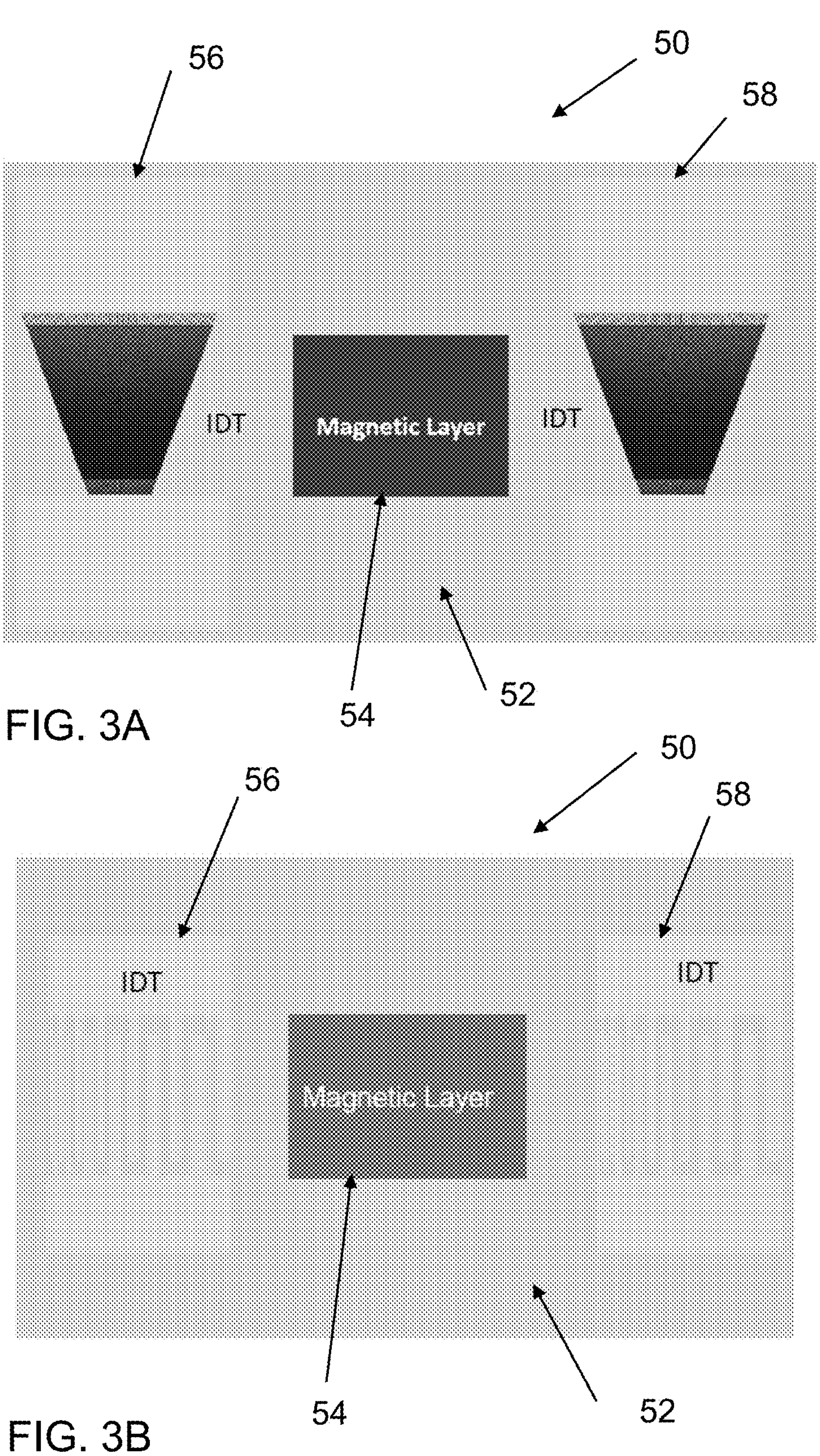
FIG. 3A illustrates interdigital transducers having non-uniform electrodes wherein the electrode fingers have non-uniform spacing (slanted).
FIG. 3B illustrates interdigital transducers having non-uniform electrodes wherein the electrode fingers have non-uniform widths (chirped).

From the above discussion, it is apparent that phase shifters and/or circulators according to the present invention can include a two port (narrow-band or wide-band) surface acoustic wave device (a pair of interdigitated electrodes), and a magnetostrictive ferromagnetic/ferrimagnetic film (or stack of magnetic materials) (subsequently referred to as magnetic film). The magnetic film is intimately bound to the piezoelectric substrate with adjacent tuning electrodes. The magnetic film is prepared such that the ferromagnetic/ferrimagnetic resonance (FMR) is well defined at zero field or low magnetic fields (<1 MHz without an external magnetic field) through some method of inherent bias, such as, for example but not limited to, an exchange bias film(s), dipolar bias film(s), strain bias through residual stress, or other bias techniques, such as, for example but not limited to, chemical treatment, plasma treatment, ion-beam, or other suitable chemical treatments. As described above, there are two sets of wide-band interdigitated electrodes (IDT)s that are in intimate contact with a ferroelectric or piezoelectric substrate. Thus, it should be clear that this phase device builds off a similar structure to a typical fixed frequency SAW filter. However, the two sets of IDTs are designed to be wide band pass, instead of typical fixed frequency SAW filters, which typically have a narrow band-pass. Typical narrow band SAWs filters are formed by two sets of IDTs with uniform spacing and uniform electrode widths, where these spatial dimensions dictate the wavelength of the acoustic waves. Whereas wide band SAW devices are created by making non-uniform electrode spacing and electrode widths (see FIGS. 3A and 3B). There are several different designs for wide band SAW transducers, including, including but not limited to, slanted IDTs and chirped IDTs. Each of these IDTs are good choices for the embodied invention depending on the desired bandwidth. These distinct electrode layouts with a non-reciprocal magnetic material located in between are unique to these phase shifters and/or circulators, whereas otherwise these electrode layouts are not useful for phase shifter and/or circulator applications because these SAW devices are reciprocal and do not introduce phase shifts due to velocity slowing. The first set of IDTs is used to convert the RF electric fields to RF acoustic waves. Then, the acoustic waves travel across the surface of the device, where they travel across the region that has the magnetic film. At FMR, these films are highly absorbing (high isolation 40-60 dB), whereas at frequencies that do not match FMR or other spin-wave conditions the films have low loss and therefore are highly transmitting. In the case of materials with non-reciprocal FMR, the bias field (external field, residual strain, exchange bias, or dipolar bias) dictates the direction the acoustic waves are allowed to pass and which direction the acoustic waves are absorbed (or not allowed to pass) and thus the bias field direction is a discriminating feature. This phase shifting mechanism can be described as nonreciprocal magnetoelastic FMR. This mechanism is highly promising due to the potentially low insertion loss (1 dB) and potentially very high (multiple pi radians) phase shifts. Acoustic waves that transmit though the magnetic film are transduced back to RF electric fields with the other set of interdigitated electrodes; this is a very efficient process. The FMR frequency can be tuned by applying a DC voltage to the adjacent electrodes, this voltage creates a strain in the piezoelectric film/substrate, which transfers strain to the magnetostrictive film, which creates a change in the FMR frequency. It should also be mentioned that the magnetostrictive magnetic film's zero-field FMR frequency can be locally tailored through inherent bias techniques mentioned above. By arranging the input and output ports appropriately in these devices, they can also be used as circulators to pass signals from one port to another while blocking the reverse signal as in a conventional circulator.

The phase shifter and/or circulator device can be manufactured through several sequential deposition and lithography steps. One example is taking the piezoelectric substrate and lithographically defining the electrodes by: depositing the IDT electrodes and the DC tuning electrodes; lifting-off the photoresist; lithographically defining the magnetic film region; depositing the low-loss magnetostrictive material; depositing the exchange bias or dipolar bias film(s); lifting-off the photoresist; and locally (band-pass or other design) or uniformly (band-gap) magnetically annealing the film, which involves locally or uniformly heating past the Curie (Neal) temperature and cooling in the presence of an external field. This process locks in the desired patterned or uniform internal bias. The magnetic film can be composed of a multi-layer stack of several materials. The device is used by applying RF electric fields to the transmitting IDT electrodes and to transform the voltages into acoustic frequencies, then apply a DC voltage to the electrodes that are adjacent to the magnetic film to strain the film through strain coupling with the underlying piezoelectric material. This voltage induced strain tunes the FMR frequency of the magnetic film and thus tunes the absorption of the film. Any acoustic waves not isolated by the film are transformed back to RF voltages though the receiving electrode.

It is noted that the phase shifter/circulator device can be manufactured through a variety of different lithography steps and arrangements. This includes, using a thin film electrode on a thicker slab of magnetic material, or using both thin films of piezoelectric and magnetic material on a non-active substrate such as silicon. There are also many different materials that can be used for the magnetic material including, for example but not limited to, low RF loss, high-magnetostrictive materials and high-loss, high magnetostrictive materials when the material has been made thin enough to enhance resistance and thus decrease RF losses through mechanisms such as eddy currents. Many different layers of ferromagnetic materials, ferromagnetic materials, anti-ferromagnetic materials, insulators, conductors, etc. can be optionally added to magnetic material multilayer stacks to achieve the non-reciprocal FMR behavior. Other alternatives include patterning the DC electrodes underneath and on top of the piezoelectric substrate capped with the magnetic film, instead of having the electrodes adjacent to the magnetic material. A similar device without the adjacent layers and wideband electrodes (narrow band, non-tunable) can be used for a magnetic sensor, which is well known by past patents that are somewhat similar. Similar isolating devices have been proposed that are fed by microstriplines or other radiation feeding methods, as opposed to being SAW-based. These devices require thick magnetic films because typical radiation pumping of FMR is not a highly absorbing mechanism, unlike acoustically driven FMR.

Figure 4A:
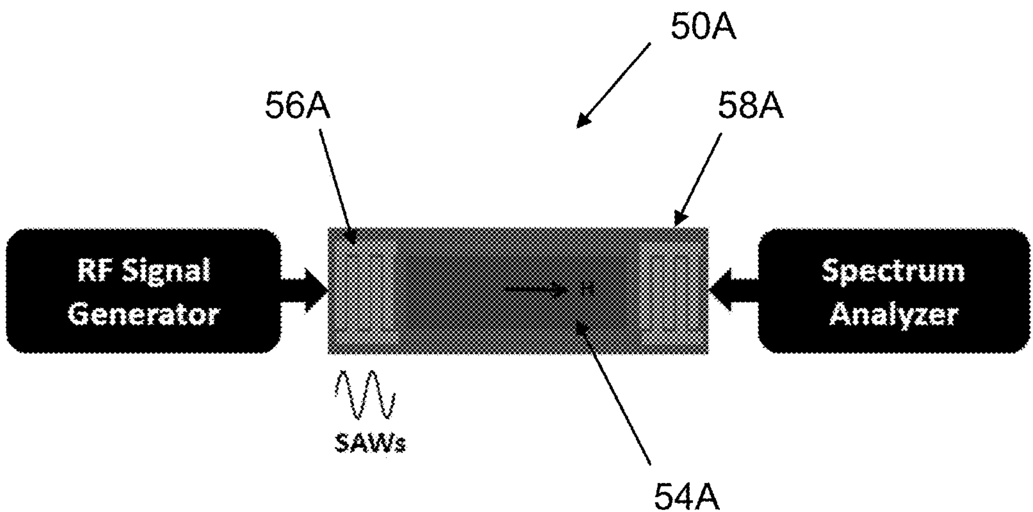
FIG. 4A illustrates a top view of a first alternative device similar to the device of FIG. 1 but utilizing a thin film SAW having an engineered substrate with a thin film of piezoelectric material thereon.
Figure 4B:
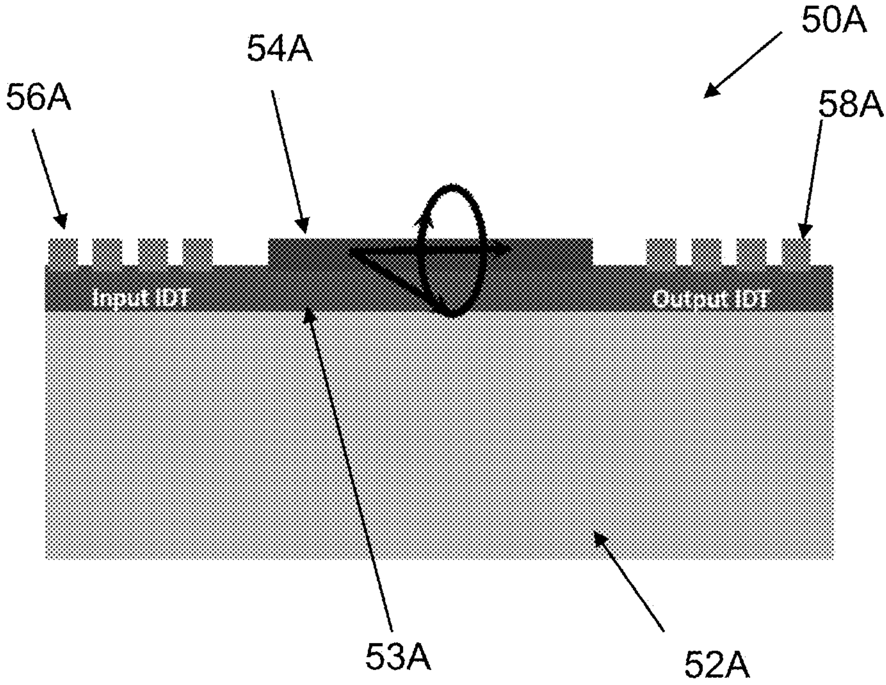
FIG. 4B illustrates a cross-sectional view taken from the device of FIG. 4A.

Referring now to FIGS. 4A and 4B, a device 50A according to another embodiment of the present invention is shown. The illustrated device 50A includes an engineered substrate 52A where the substrate 52A is formed by a non-piezoelectric material in contrast to the substrate 52 of device 50 which is formed of a piezoelectric material. The substrate 52A can be formed of, for example but not limited to, Si, SiC, sapphire, diamond, any other suitable higher acoustic velocity material, or any combination thereof. The substrate 52A has an engineered layer or thin film of piezoelectric material 53A located on a surface of the substrate 52A. The layer or thin film of piezoelectric material 53A can be formed of, for example but not limited to, LN, LT, AIN, ZnO, ALScN, or the like. The adjacent magnetic film or stack of films 54A, the first or input IDT 56A, and the second or output IDT 58A are each provided over the layer or thin film of piezoelectric material 53A.

The physical mechanism of this phase device is based on the coupling between acoustic waves in the piezoelectric layer or thin film 52A and spin waves in the adjacent magnetic film or stack of films 54A. The configuration of the magnetic film 54 allows for a strongly nonreciprocal dispersion law of spin waves, while magnetoelastic coupling effectively shifts the phase of acoustic waves differently depending on their direction of travel.

Figures 4C, 4D:
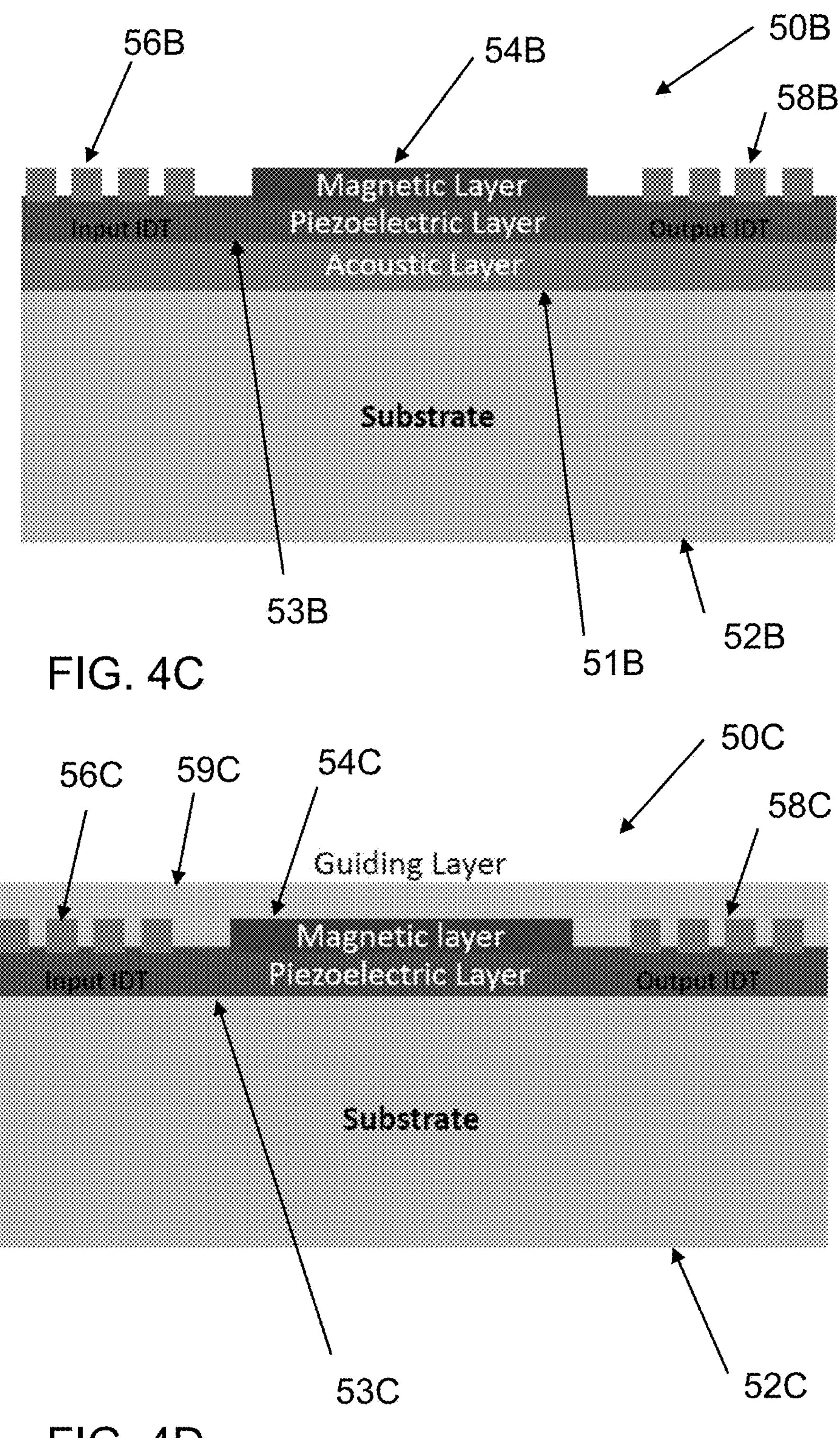
FIG. 4C illustrates a first variation of the device of FIG. 4A utilizing a thin film SAW with a second acoustic layer.
FIG. 4D illustrates a second variation of the device of FIG. 4A utilizing a thin film SAW with a guiding layer.

Referring now to FIG. 4C, a device 50B is shown which is a variation of the device 50A shown in FIG. 4B. The illustrated device 50B includes an engineered substrate 52B where the substrate 52B is formed by a non-piezoelectric material. The substrate 52B has an engineered acoustic layer 51B located on a surface of the substrate 52B. The acoustic layer 51B can be formed of, for example but not limited to, SiC, sapphire, diamond, any other suitable higher acoustic velocity material, or the like. The acoustic layer 51B enables the substrate 52B to comprise any desired material. An engineered layer or thin film of piezoelectric material 53B located on the engineered acoustic layer 51B. The layer or thin film of piezoelectric material 53B can be formed of, for example but not limited to, LN, LT, AIN, ZnO, ALScN, or the like. The adjacent magnetic film or stack of films 54B, the first or input IDT 56B, and the second or output IDT 58B are each provided over the layer or thin film of piezoelectric material 53B. It is noted that device 50B can alternatively include any other suitable features or configurations disclosed herein with regard to any of the other disclosed devices.

Referring now to FIG. 4D, a device 50C is shown which is a variation of the device 50A shown in FIG. 4B. The illustrated device 50C includes an engineered substrate 52C where the substrate 52C is formed by a non-piezoelectric material. An engineered layer or thin film of piezoelectric material 53C is located on a surface of the substrate 52C. The layer or thin film of piezoelectric material 53C can be formed of, for example but not limited to, LN, LT, AIN, ZnO, ALScN, or the like. The adjacent magnetic film or stack of films 54C, the first or input IDT 56C, and the second or output IDT 58C are each provided over the layer or thin film of piezoelectric material 53C. A conforming guiding layer or coating 59C is provided over the engineered layer or thin film of piezoelectric material 53C, the magnetic film or stack of films 54C, the first or input IDT 56C, and the second or output IDT 58C. The guiding layer or coating 53C can be formed of, for example but not limited to, SiO2, or the like. It is noted that device 50C can alternatively include any other suitable features or configurations disclosed herein with regard to any of the other disclosed devices.

Figures 5, 6:
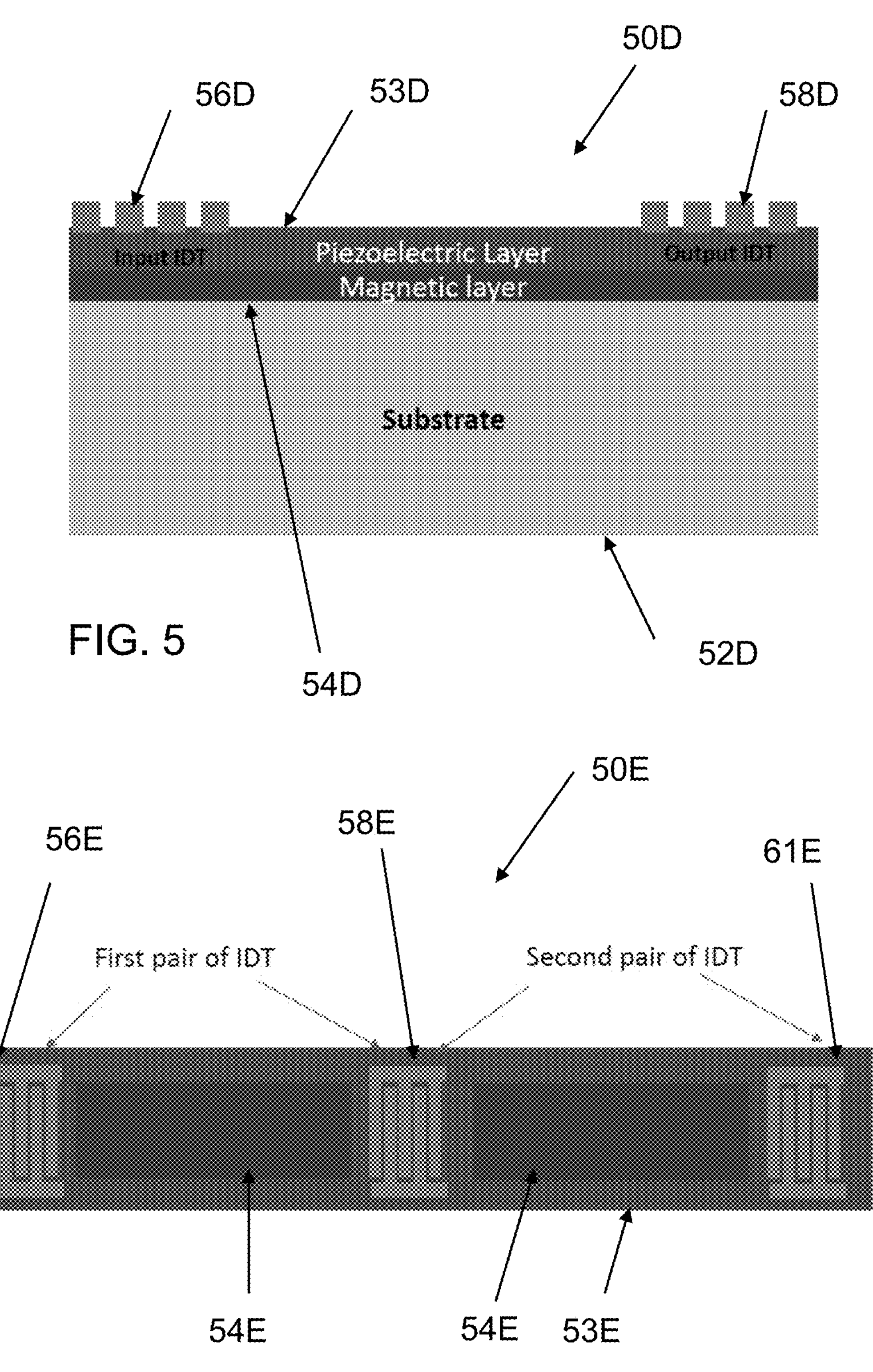
FIG. 5 illustrates a second alternative device similar to the device of FIG. 1 but having an engineered substrate and a piezoelectric coating or layer burying the magnetic layer.
FIG. 6 illustrates a third alternative device similar to the device of FIG. 4A but two pairs of transducers configured for a circulator.

Referring now to FIG. 5, a device 50D according to yet another embodiment of the present invention is shown. The illustrated device 50D includes an engineered substrate 52D where the substrate 52D is formed by a non-piezoelectric material in contrast to the substrate 52 of device 50 which is formed of a piezoelectric material. The substrate 52A can be formed of, for example but not limited to, Si, SiC, sapphire, diamond, any other suitable higher acoustic velocity material, or any combination thereof. The magnetic film or stack of films 54D is located over the substrate 52D. A coating or thin film of piezoelectric material 53D located over the magnetic film or stack of films 54D. The layer or thin film of piezoelectric material 53D can be formed of, for example but not limited to, LN, LT, AIN, ZnO, ALScN, or the like. The first or input IDT 56D, and the second or output IDT 58D are each provided over the layer or thin film of piezoelectric material 53D. It is noted that device 50D can alternatively include any other suitable features or configurations disclosed herein with regard to any of the other disclosed devices.

Referring now to FIG. 6, a device 50E according to yet another embodiment of the present invention is shown. Device 50E is similar to device 50A of FIGS. 4A and 4B but it is configured with two pairs of IDTs instead of one pair of IDTs and thus can be utilized with a Circulator. The illustrated device 50E includes an engineered substrate (not shown) where the substrate formed by a non-piezoelectric material in contrast to the substrate 52 of device 50 which is formed of a piezoelectric material. The substrate can be formed of, for example but not limited to, Si, SiC, sapphire, diamond, any other suitable higher acoustic velocity material, or any combination thereof. The substrate has an engineered layer or thin film of piezoelectric material 53E located on a surface of the substrate 52A. The layer or thin film of piezoelectric material 53E can be formed of, for example but not limited to, LN, LT, AlN, ZnO, ALScN, or the like. The first IDT 56E, the second IDT 58E, and a third IDT 61E are each provided over the layer or thin film of piezoelectric material 53A in a spaced-apart manner. A first magnetic film or stack of films 54E is provided on the layer or thin film of piezoelectric material 53E adjacent to and between the first IDT 56E and the second IDT 58E such that the first and second IDTs 56E, 58E form a first pair of IDTs as shown. A second magnetic film or stack of films 54E is provided on the layer or thin film of piezoelectric material 53E adjacent to and between the second IDT 58E and the third IDT 61E such that the second and third IDTs 58E, 61E form a second pair of IDTs as shown. It is noted that device 50E can alternatively include any other suitable features or configurations disclosed herein with regard to any of the other disclosed devices.

Figure 7A:
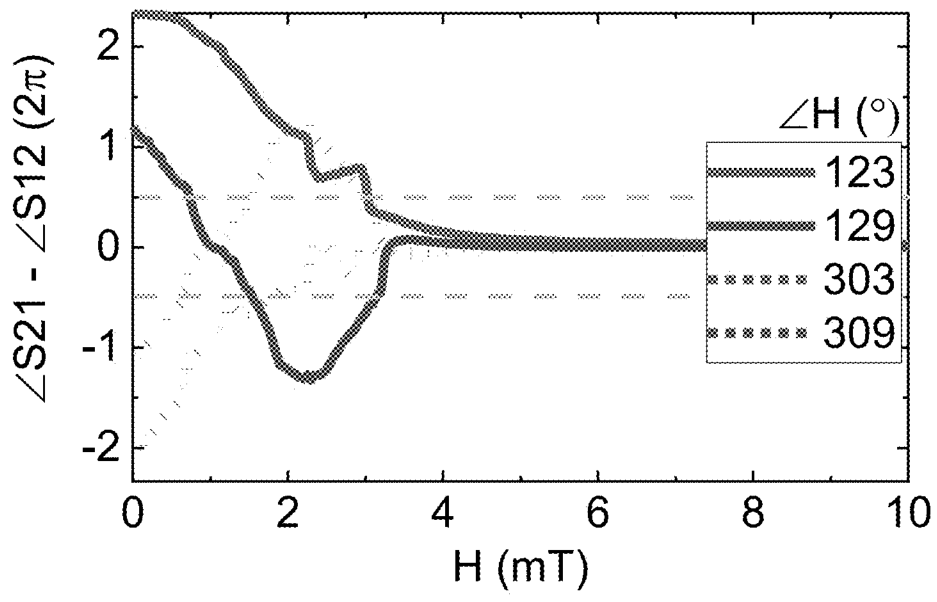
FIG. 7A illustrates measured nonreciprocal phase accumulation for different Applied field angles for the device of FIG. 1.

FIG. 7A illustrates nonreciprocal phase accumulation for different applied field angles. Dashed horizontal lines indicate p phase nonreciprocity, which is the necessary condition for phase device applications.

Figure 7B:
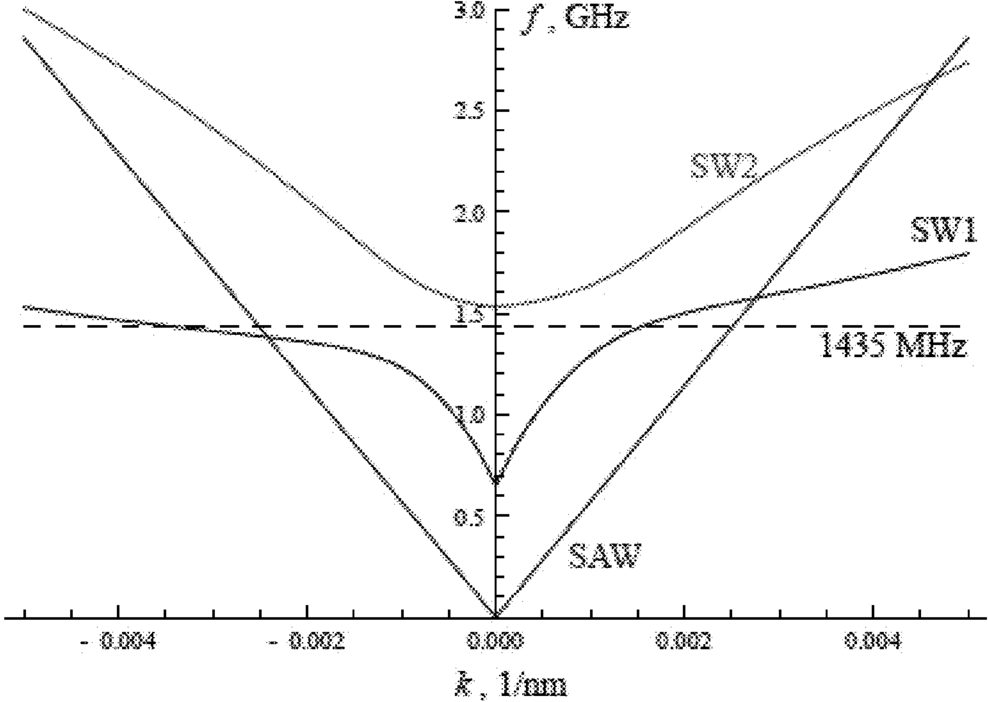
FIG. 7B illustrates Calculated spectra of SAW and spin waves in a quasiantiferromagnetic state for large phase nonreciprocity of the device of FIG. 1.

FIG. 7B illustrates calculated spectra of SAW and spin waves in a quasiantiferromagnetic state for large phase nonreciprocity. The spin-wave spectrum consists of two branches, SW1 and SW2, the latter of which is higher in frequency. Mode repulsion of hybridized magnetoelastic waves at the crossing points is on the order of 20 MHz and is not visible on this frequency scale. The excitation frequency fe=1435 MHz is marked by a dashed horizontal line.

While not wishing to be bound by theory, a dynamic theory that is applicable for any mono-domain magnetic ground state of a magnetic bilayer is described here. Of particular interest is a case where ferromagnetic layers are oriented in an antiparallel fashion and the uniaxial magnetic anisotropy axes are collinear in both layers. In the absence of an external magnetic field the magnetization vectors are naturally oriented in opposite directions, while an external magnetic field tilts the magnetization vectors creating a canted ground state. Calculations of the static magnetic states in such a system is quite cumbersome, but well known in literature. For simplicity, the films are presumed to be composed of identical magnetic material and have identical thickness L. The layers are separated by a nonmagnetic spacer with thickness d. The layers are also presumed to be sufficiently thin (L «),) with respect to spin wave wavelength A.

A general theory of SAW/spin wave interactions has been developed and described in R. VERBA et al., "Wide-band nonreciprocity of surface acoustic waves induced by magnetoelastic coupling with a synthetic antiferromagnet," Phys. Rev. Appl., Vol. 12 (2019) 054061 and R. VERBA et al., "Nonreciprocal surface acoustic surface waves in multilayers with magnetoelastic and interfacial Dzyaloshinskii-Moriya interactions," Phys. Rev. Appl., Vol. 9 (2018) 064014. Several approximations are made to render the analytical calculations manageable. First, the magnetic layer acoustically is considered to be identical to the substrate material, i.e., we do not take into account the mass loading effect. In general, mass loading is important for SAW IDT matching, however, as the mass loading is a purely mechanical effect it does not contribute to nonreciprocity. Second, the magnetoelastic coupling energy is presumed to be much smaller than other interaction energies in the system, which is practically always true for ferromagnets with strong magnetostriction.

Figure 8:
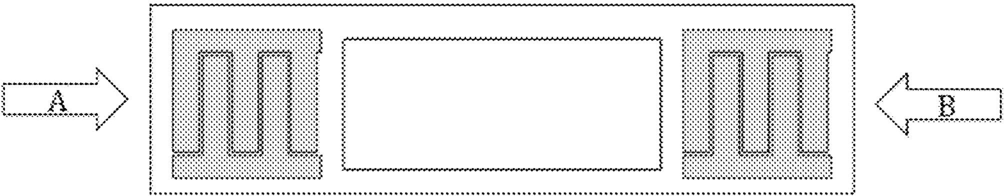
FIG. 8 schematically shows a test set up for the device of FIG. 1.

As an example, for evaluating the device of FIG. 1, a Vector Network Analyzer (Keysight NXXXX) delivered RF with 20 dBm power to port 1 of the device (arrow A), and the output was measured at port 2 (arrow B), as shown in FIG. 8. The input power remained in the linear regime, where the characteristics of the results are not power-dependent. At higher powers, nonlinear behavior may occur. Time gating was used to isolate the signal transmitted via SAWs, which is delayed by about 1 μs compared to the EM radiative signal because of the slower velocity of SAWs. A vector electromagnet was used to sweep the angle φ and magnitude H of the magnetizing field. The magnitude was swept from high (4 mT) to low (0 mT) to ensure consistency in hysteretic behavior. To measure the nonreciprocal transmission behavior of the device, the complex values of S21 and S12 were measured simultaneously.

Figure 9:
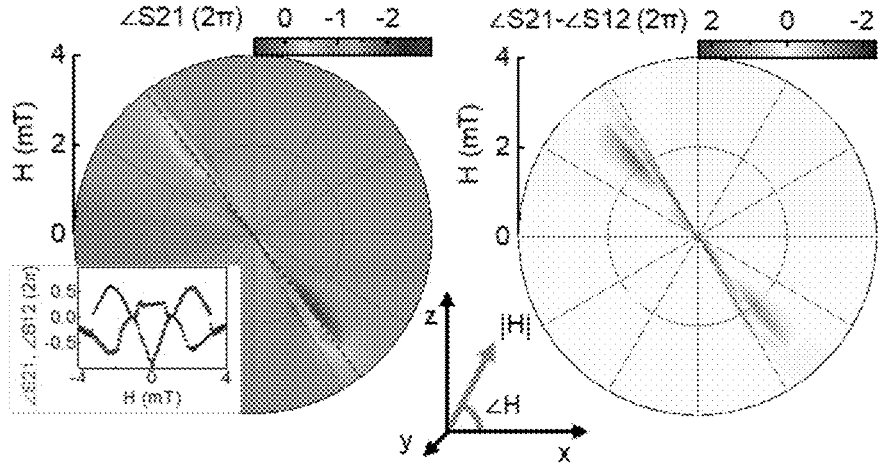
FIG. 9 illustrates conventional angle- and magnitude-dependent magnetic field sweep versus S21 phase plot from the device of FIG. 1 driven at 1435 MHz.

FIG. 9 shows a conventional angle- and magnitude-dependent magnetic field sweep versus S21 phase plot from the device driven at 1435 MHz. Here, the growth field $H_G$ was applied at 30° relative to +z. In all prior reports of ADSWR in Ni, broad absorption resonances occurred in all four quadrants with even and odd symmetry. Notable distinctions of these measurement include: (1) breaking even symmetry, with lobes occurring only in quadrants II and IV; (2) extremely narrow line width, indicating low damping and therefore high frequency selectivity; (3) acoustic wave absorption much larger than any previously reported results; and (4) high nonreciprocity in opposite SAW travel directions.

Referring still to FIG. 9, the orange color indicates the field-independent phase shift (far from magnetic resonance) normalized to 0.

Resonant absorption of SAWs by spin waves in the magnetic material and the resulting phase shifts appear as other colors on the scale, and none of this interaction was observed along the growth field axis 60° (quadrant I) and 240° (quadrant III). Interactions only exist in the perpendicular directions 129° (quadrant II) and 309° (quadrant IV). These conditions of maximum acoustic spin interaction are highlighted by the red line cuts in the inset. Reversing the SAW propagation direction under the same field conditions results in the blue line cuts, which are nearly reversed in comparison indicating the very different phase shifting between opposite-traveling waves.

The isolation (i.e., the difference between forward and reverse phase shifting) measured at both resonant angles is up to 2 complete cycles or 4η. This exceeds the necessary nonreciprocity of π needed for a device to be effective in many applications such as circulators. Additionally, the size and weight benefits are substantial compared to the state of the art. To give a perspective on the size and weight benefits, the sizes of current commercial packages range from approximately 40 mm to 75 mm, whereas the sizes of the devices according to embodiments of the present invention are less than 8 mm, which translates to about five to ten-times advantage in physical size. Similarly, the weights of the integrated device packages according to embodiments of the present invention are from about 10× to about 20× less than current commercial devices.

Figure 10:
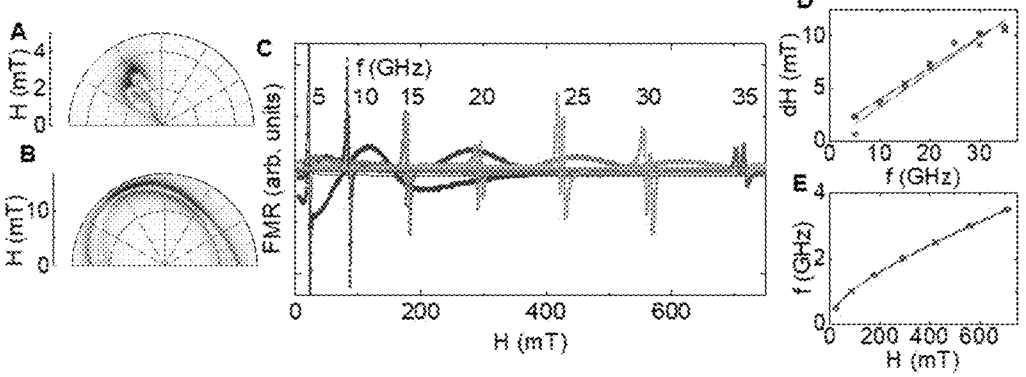
FIG. 10 illustrates the ferromagnetic resonance of the device of FIG. 1 over certain conditions.

FIG. 10 illustrates ferromagnetic resonance at (A) 1435 MHz and (B) 4 GHz. (C) FMR frequency sweep. (D) Linear fit indicating inhomogeneous broadening of 1 and 0 mT, and Gilbert damping of 0.0045 and 0.0050 for the individual layers. (E) Kittel fit indicating saturation magnetization of 1.2 T.

Additional information is described in (1) U.S. Pat. No. 10,601,400, entitled "Frequency tunable RF filters via a wide-band SAW-multiferroic hybrid device", which issued 24 Mar. 2020, and (2) Derek A. Bas et al., "Nonreciprocity of Phase Accumulation and Propagation Losses of Surface Acoustic Waves in Hybrid Magnetoelastic Heterostructures", Physical Review Applied 18, 044003 (2022). The disclosures of which are hereby expressly incorporated by reference in their entireties.

The present invention provides a major improvement to microwave/RF signal processing components in the form of several order of magnitude improvement in size, weight, power, and cost (SWaP-C). Current technologies have been pushed to the state of the art in SWaP-C and are very expensive and still quite bulky. The present invention reduces the size, weight, and power to chip scale technologies (micrometer sized lateral dimensions and nanoscale thicknesses) and thus makes the technology highly amenable to arraying, which will enable new capabilities. Many other complex approaches have been explored to accomplish the capabilities that the present invention provides, including superconductors and RF-photonics. The present invention is superior to those other approaches from the standpoint of using simple commercially available hardware that is already used in most microwave/RF systems with the small modification of adding a nonreciprocal magnetic material. The present invention has the potential to be a breakthrough in terms of adding new capabilities, such as simultaneous beamforming of one or more transmit and receive signals, to current RF/microwave systems used for communications, radar, ISR and other functions.

The disclosure of all patents, patent applications (and any patents which issue thereon, as well as any corresponding published foreign patent applications), and all publications mentioned throughout this description are hereby incorporated by reference herein. It is expressly not admitted, however, that any of the documents incorporated by reference herein teach or disclose the present invention.

It should be understood that every maximum numerical limitation given throughout this specification includes every lower numerical limitation, as if such lower numerical limitations were expressly written herein. Every minimum numerical limitation given throughout this specification includes every higher numerical limitation, as if such higher numerical limitations were expressly written herein. Every numerical range given throughout this specification includes every narrower numerical range that falls within such broader numerical range, as if such narrower numerical ranges were all expressly written herein.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A nonreciprocal microwave phase shift device comprising:

a substrate;

a plurality of transducers on a surface of the substrate and configured to reciprocally convert between electrical signals and acoustic waves;

a first piezoelectric material configured to generate and transport acoustic waves from a signal applied to a first transducer of the plurality of transducers; and a thin film magnetic material configured to couple to acoustic waves through magnetoelastic coupling so as to have non-reciprocal magnetoelastic coupled acoustic wave transport;

wherein transmission of acoustic waves through the thin film magnetic material in a direction toward a second transducer of the plurality of transducers has a first magnitude and transmission of acoustic waves through the thin film magnetic material in a direction away from the second transducer of the plurality of transducers has a second magnitude, the first and second magnitudes being significantly different.

2. The nonreciprocal microwave phase shift device of claim 1, wherein each of the plurality of transducers is an interdigital transducer, each interdigital transducer comprises a pair of split-finger electrodes, and the first and second transducers form a first pair of interdigital transducers.

3. The nonreciprocal microwave phase shift device of claim 2, wherein the thin film magnetic material on the surface of the substrate is positioned proximate to the first interdigital transducer such that acoustic waves emitted from the first interdigital transducer are received by the thin film magnetic material.

4. The nonreciprocal microwave phase shift device of claim 3, wherein the second interdigital transducer is positioned proximate to the thin film magnetic material and opposite to the first interdigital transducer such that the thin film magnetic material is positioned between the first and second interdigital transducers.

5. The nonreciprocal microwave phase shift device of claim 4, further comprising: a third interdigital transducer of the plurality of transducers positioned proximate to another thin film magnetic material and opposite to the second interdigital transducer such that the another thin film magnetic material is positioned between the second, and third interdigital transducers.

6. The nonreciprocal microwave phase shift device of claim 5 wherein the device is a microwave circulator.

7. The nonreciprocal microwave phase shift device of claim 4, wherein spacings of the first and second split-finger interdigital transducers differ and electrodes of the first and second pairs of split-finger interdigital transducers are slanted, and wherein differing spacings between the slanted electrodes is configured to control a frequency bandwidth of the device.

8. The nonreciprocal microwave phase shift device of claim 4, wherein spacings of the first and second split-finger interdigital transducers are designed such that acoustic waves are focused, and a power density of the thin film magnetic material is high to enable non-linear behavior.

9. The nonreciprocal microwave phase shift device of claim 2, wherein the first interdigital transducer comprises an input electrode and an output electrode, the input electrode having a width that is different from a width of the output electrode, and wherein differing widths of the input and output electrodes provides a chirped spacing configured to control a frequency bandwidth of the device.

10. The nonreciprocal microwave phase shift device of claim 1, wherein the thin film magnetic material is locally patterned onto the surface of the substrate and the first piezoelectric material is conformally coated over the surface of the substrate and the thin film magnetic material.

11. The nonreciprocal microwave phase shift device of claim 10, wherein the substrate comprises diamond.

12. The nonreciprocal microwave phase shift device of claim 1, wherein the first piezoelectric material comprises a thin film coating on the surface of the substrate and the thin film magnetic material is coated on the thin film of the first piezoelectric material.

13. The nonreciprocal microwave phase shift device of claim 12, wherein the substrate comprises an engineered substrate.

14. The nonreciprocal microwave phase shift device of claim 1, wherein the substrate comprises a second piezoelectric material.

15. The nonreciprocal microwave phase shift device of claim 14, wherein the second piezoelectric material is selected from the group consisting of $LiNbO_3$, y-cut $LiNbO_3$, ZnO, AlN, quartz, and GaAs.

16. The nonreciprocal microwave phase shift device of claim 1, wherein the thin film magnetic material comprises a single magnetic material and a symmetry breaking heavy metal.

17. The nonreciprocal microwave phase shift device of claim 16, wherein the thin film magnetic material is replaced with nonmagnetic platinum with a nonreciprocal acoustic wave transport.

18. The nonreciprocal microwave phase shift device of claim 1, wherein the thin film magnetic material comprises a single magnetic material and a semiconductor having interfacial symmetry breaking for nonreciprocal acoustic wave transport.

19. The nonreciprocal microwave phase shift device of claim 1, wherein the thin film magnetic material comprises a single ferrimagnetic material with nonreciprocal magnetoelastic transport.

20. The nonreciprocal microwave phase shift device of claim 19, wherein the single ferromagnetic material is a ferrite or yttrium iron garnet.

21. The nonreciprocal microwave phase shift device of claim 1, wherein the thin film magnetic material is composed of a single anti-ferromagnetic material with nonreciprocal magnetoelastic transport.

22. The nonreciprocal microwave phase shift device of claim 21, wherein the single anti-ferromagnetic material is a nickel oxide.

23. The nonreciprocal microwave phase shift device of claim 1, wherein the thin film magnetic material comprises a composite.

24. The nonreciprocal microwave phase shift device of claim 23, wherein the composite comprises a stack of alternating layers of a first material and a second material.

25. The nonreciprocal microwave phase shift device of claim 24, wherein the first material is magnetic, and the second material is dielectric.

26. The nonreciprocal microwave phase shift device of claim 25, where the layers of the first material are antiferromagnetically coupled across layers of the second material.

27. The nonreciprocal microwave phase shift device of claim 24, wherein the first material is FeGaB, and the second material is Al2O3.

28. The nonreciprocal microwave phase shift device of claim 27, wherein a thickness of the Al2O3 is about 1 nm to about 70 nm.

29. The nonreciprocal microwave phase shift device of claim 23, wherein the composite has a thickness ranging from about 1 nm to about 1 μm.

30. The nonreciprocal microwave phase shift device of claim 23, wherein the composite has a width ranging from about 1 μm to about 1 mm.

31. The nonreciprocal microwave phase shift device of claim 1, wherein a residual stress is applied to induce strain bias in the thin film magnetic material configured to offset a frequency of the magnetoelastic coupling.

32. The nonreciprocal microwave phase shift device of claim 1, further comprising a permanent magnet or an electromagnet configured to alter a frequency of the magnetoelastic coupling.

33. The nonreciprocal microwave phase shift device of claim 32, where the permanent magnet or the electromagnet is positioned at an arbitrary angle with respect to the device and is configured to alter the non-reciprocal transmission and isolation.

34. The nonreciprocal microwave phase shift device of claim 1, further comprising a pair of uniform electrodes configured to supply a low frequency electric field that alters a frequency of the magnetoelastic coupling.

35. The nonreciprocal microwave phase shift device of claim 34, wherein the device is switchable.

* * * * *